US007979762B2

(12) United States Patent
Esaka et al.

(10) Patent No.: US 7,979,762 B2
(45) Date of Patent: Jul. 12, 2011

(54) INTEGRATED CIRCUIT BOARD WITH JTAG FUNCTIONS

(75) Inventors: Satoshi Esaka, Fukuoka (JP); Masayuki Furuta, Fukuoka (JP); Masataka Kushigemachi, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 317 days.

(21) Appl. No.: 12/320,834

(22) Filed: Feb. 5, 2009

(65) Prior Publication Data

US 2009/0307547 A1 Dec. 10, 2009

(30) Foreign Application Priority Data

Jun. 4, 2008 (JP) ................................ 2008-147214

(51) Int. Cl.
*G01R 31/28* (2006.01)

(52) U.S. Cl. ........................................ 714/727; 714/742

(58) Field of Classification Search .................. 714/714, 714/724, 726, 727, 742

See application file for complete search history.

(56) References Cited

U.S. PATENT DOCUMENTS

| | | | | |
|---|---|---|---|---|
| 6,941,243 | B1 * | 9/2005 | Maciona et al. | 702/182 |
| 7,139,949 | B1 * | 11/2006 | Jennion et al. | 714/726 |
| 7,665,049 | B2 * | 2/2010 | Muranaka | 716/136 |
| 2006/0200715 | A1 | 9/2006 | Avery et al. | |
| 2007/0046309 | A1 * | 3/2007 | LaBerge | 324/765 |

FOREIGN PATENT DOCUMENTS

| | | |
|---|---|---|
| JP | 2006-519388 | 8/2006 |
| WO | 2004/079382 | 9/2004 |

OTHER PUBLICATIONS

Barr, R.W.; Chen-Huan Chiang; Wallace, E.L.; , "End-to-end testing for boards and systems using boundary scan," Test Conference, 2000. Proceedings. International , vol., No., pp. 585-592, 2000 doi: 10.1109/TEST.2000.894252 URL: http://ieeexplore.ieee.org/stamp/stamp.jsp?tp=&arnumber=894252&isnumber=19342.*

Be Van Ngo; Law, P.; Sparks, A.; , "Use of JTAG boundary-scan for testing electronic circuit boards and systems," AUTOTESTCON, 2008 IEEE , vol., No., pp. 17-22, Sep. 8-11, 2008 doi: 10.1109/AUTEST.2008.4662576 URL: http://ieeexplore.ieee.org/stamp/stamp.jsp?tp=&arnumber=4662576&isnumber=4662554.*

Tulloss, R.E.; Yau, C.W.; , "BIST and boundary-scan for board level test: test program pseudocode," European Test Conference, 1989., Proceedings of the 1st , vol., No., pp. 106-111, Apr. 12-14, 1989 doi: 10.1109/ETC.1989.36230 URL: http://ieeexplore.ieee.org/stamp/stamp.jsp?tp=&arnumber=36230&isnumber=1513.*

"IEEE Standard Test Access Port and Boundary-Scan Architecture," IEEE Std 1149.1-2001 , vol., No., pp. i-200, 2001 doi: 10.1109/IEEESTD.2001.92950 URL: http://ieeexplore.ieee.org/stamp/stamp.jsp?tp=&arnumber=938734&isnumber=20326.*

* cited by examiner

*Primary Examiner* — Cynthia Britt
(74) *Attorney, Agent, or Firm* — Staas & Halsey LLP

(57) ABSTRACT

In an integrated circuit board, a plurality of integrated circuits to be checked are connected together in a star shape. Operation clock data for JTAG of each integrated circuit and check data for checking each integrated circuit are stored. When an integrated circuit to be checked is specified, operation clock data for JTAG and check data for the specified integrated circuit are determined. With an operation clock for JTAG according to the determined operation clock data for JTAG, the determined check data is input to the specified integrated circuit. Based on the check data and output data output from the integrated circuit to which this check data is input, the integrated circuit board determines a malfunction in the integrated circuit, and then stores the determination result in a storage device.

10 Claims, 7 Drawing Sheets

FIG.2

| | TERM | ADDRESS | | | | | | | | | | | | | CHECK/WRITE DATA [MEGABIT] |
|---|---|---|---|---|---|---|---|---|---|---|---|---|---|---|---|
| | | SETTING VALUE BIT | | | | | | | | LOWER BIT [n] | | | | | |
| AT SCAN TEST | 1 | 0 | 0 | 0 | 0 | 0 | 0 | 0 | 0 | 0 | 0 | ·· | 0 | 0 | #A SCAN TEST DATA |
| | | | | | | | | | | 1 | 1 | ·· | 1 | 1 | #A SCAN TEST DATA |
| | 2 | | | | | 0 | 0 | 0 | 1 | 0 | 0 | ·· | 0 | 0 | #B SCAN TEST DATA |
| | | | | | | | | | | 1 | 1 | ·· | 1 | 1 | #B SCAN TEST DATA |
| | 3 | | | | | 0 | 0 | 1 | 0 | 0 | 0 | ·· | 0 | 0 | #C SCAN TEST DATA |
| | | | | | | | | | | 1 | 1 | ·· | 1 | 1 | #C SCAN TEST DATA |
| | 4 | | | | | 0 | 0 | 1 | 1 | 0 | 0 | ·· | 0 | 0 | #D SCAN TEST DATA |
| | | | | | | | | | | 1 | 1 | ·· | 1 | 1 | #D SCAN TEST DATA |
| | 5 | | | | | 0 | 1 | 0 | 0 | 0 | 0 | ·· | 0 | 0 | #E SCAN TEST DATA |
| | | | | | | | | | | 1 | 1 | ·· | 1 | 1 | #E SCAN TEST DATA |
| AT NET TEST | 6 | | | 0 | 1 | 0 | 0 | 0 | 0 | 0 | 0 | ·· | 0 | 0 | #A NET TEST DATA FOR PERIPHERAL CHECK |
| | | | | | | | | | | 1 | 1 | ·· | 1 | 1 | #A NET TEST DATA FOR PERIPHERAL CHECK |
| | 7 | | | | | 0 | 0 | 0 | 1 | 0 | 0 | ·· | 0 | 0 | #B NET TEST DATA FOR PERIPHERAL CHECK |
| | | | | | | | | | | 1 | 1 | ·· | 1 | 1 | #B NET TEST DATA FOR PERIPHERAL CHECK |
| | 8 | | | | | 0 | 0 | 1 | 0 | 0 | 0 | ·· | 0 | 0 | #C NET TEST DATA FOR PERIPHERAL CHECK |
| | | | | | | | | | | 1 | 1 | ·· | 1 | 1 | #C NET TEST DATA FOR PERIPHERAL CHECK |
| | 9 | | | | | 0 | 0 | 1 | 1 | 0 | 0 | ·· | 0 | 0 | #D NET TEST DATA FOR PERIPHERAL CHECK |
| | | | | | | | | | | 1 | 1 | ·· | 1 | 1 | #D NET TEST DATA FOR PERIPHERAL CHECK |
| | 10 | | | | | 0 | 1 | 0 | 0 | 0 | 0 | ·· | 0 | 0 | #E NET TEST DATA FOR PERIPHERAL CHECK |
| | | | | | | | | | | 1 | 1 | ·· | 1 | 1 | #E NET TEST DATA FOR PERIPHERAL CHECK |
| | 11 | | | | | 1 | 0 | 0 | 0 | 0 | 0 | ·· | 0 | 0 | NET TEST DATA FOR ALL-DEVICE PERIPHERAL CHECK |
| | | | | | | | | | | 1 | 1 | ·· | 1 | 1 | NET TEST DATA FOR ALL-DEVICE PERIPHERAL CHECK |
| AT WRITING DEVICE DATA | 12 | | | 1 | 0 | 0 | 0 | 1 | 0 | 0 | 0 | ·· | 0 | 0 | #C PLD DATA FOR WRITING |
| | | | | | | | | | | 1 | 1 | ·· | 1 | 1 | #C PLD DATA FOR WRITING |
| | 13 | | | | | 0 | 1 | 0 | 0 | 0 | 0 | ·· | 0 | 0 | #E FPGA DATA FOR WRITING |
| | | | | | | | | | | 1 | 1 | ·· | 1 | 1 | #E FPGA DATA FOR WRITING |
| AT LOG READING | 14 | 1 | 0 | 0 | 0 | 0 | ·· | | | | 0 | 0 | 0 | 0 | LOG INFORMATION STORAGE AREA |
| | | | 1 | 1 | 1 | 1 | ·· | | | | 1 | 1 | 1 | 1 | |

FIG.3

| DEVICE ID | OPERATION CLOCK DATA FOR JTAG |
|---|---|
| A | 1 MHz |
| B | 10 MHz |
| C | 5 MHz |
| D | 5 MHz |
| E | 10 MHz |
| ... | ... |

FIG.4

| TERM | SETTING VALUE BIT | | | | | | | | SUMMARY | ACTIVATION CONDITION |
|---|---|---|---|---|---|---|---|---|---|---|
| 1 | 0 | 0 | 0 | 0 | 0 | 0 | 0 | 0 | #A SCAN TEST | EFFECTIVE ONLY WHEN PON/ PRESS-BUTTON SWITCH IS PRESSED |
| 2 | | | | | 0 | 0 | 0 | 1 | #B SCAN TEST | |
| 3 | | | | | 0 | 0 | 1 | 0 | #C SCAN TEST | |
| 4 | | | | | 0 | 0 | 1 | 1 | #D SCAN TEST | |
| 5 | | | | | 0 | 1 | 0 | 0 | #E SCAN TEST | |
| 6 | | | | | 1 | 0 | 0 | 0 | COLLECTIVELY PERFORM SCAN TESTS #A TO #E | |
| 7 | | | 0 | 1 | 0 | 0 | 0 | 0 | #A NET TEST FOR PERIPHERAL CONNECTION DEVICE | EFFECTIVE AT PON/ PRESS BUTTON SW/ FAILURE INTERRUPT |
| 8 | | | | | 0 | 0 | 0 | 1 | #B NET TEST FOR PERIPHERAL CONNECTION DEVICE | |
| 9 | | | | | 0 | 0 | 1 | 0 | #C NET TEST FOR PERIPHERAL CONNECTION DEVICE | |
| 10 | | | | | 0 | 0 | 1 | 1 | #D NET TEST FOR PERIPHERAL CONNECTION DEVICE | |
| 11 | | | | | 0 | 1 | 0 | 0 | #E NET TEST FOR PERIPHERAL CONNECTION DEVICE | |
| 12 | | | | | 1 | 0 | 0 | 0 | #A TO #E NET TEST AMONG ALL DEVICES | |
| 13 | | | 1 | 0 | 0 | 0 | 1 | 0 | WRITE PLD DATA #C | WHEN PRESS BUTTON SWITCH IS PRESSED |
| 14 | | | | | 0 | 1 | 0 | 0 | WRITE FPGA DATA #E | |
| 15 | | | | | 1 | × | × | × | COLLECTIVELY WRITE #C AND #E | |
| 16 | | 1 | × | × | × | × | × | × | PERFORM NET TEST ONLY FOR FAILURE-INTERRUPT PERIPHERAL DEVICE | EFFECTIVE AT FAILURE INTERRUPT |
| 17 | 1 | × | × | × | × | × | × | × | READ FAILURE LOG INFORMATION | EFFECTIVE WHEN ACTIVATING FROM PRESS BUTTON/EXTERNAL |

INTEGRATED CIRCUIT BOARD WITH JTAG FUNCTIONS

CROSS-REFERENCE TO RELATED APPLICATION(S)

This application is based upon and claims the benefit of priority of the prior Japanese Patent Application No. 2008-147214, filed on Jun. 4, 2008, the entire contents of which are incorporated herein by reference.

FIELD

The embodiment(s) discussed herein is(are) directed to an integrated circuit board provided with JTAG function and including a plurality of JTAG-function-provided integrated circuits.

BACKGROUND

Conventionally, an integrated circuit with a Joint Test Action Group (JTAG) function (in other words, a substrate including a plurality of integrated circuits) is checked, for example, through a method as depicted in FIG. 6. FIG. 6 is a drawing for explaining a conventional integrated-circuit checking method. JTAG is standardized according to IEEE 1149.1-1990, for example.

As depicted in FIG. 6, a test-target device (board) 10 includes integrated circuits 11 to 15 to be checked, and the integrated circuits 11 to 15 are in a cascade connection. The integrated circuits 11 to 15 are varied in operation speed. The operation speed of the integrated circuit 11 is 1 megahertz, the operation speed of the integrated circuit 12 is 10 megahertz, the operation speed of the integrated circuit 13 is 5 megahertz, the operation speed of the integrated circuit 14 is 5 megahertz, and the operation speed of the integrated circuit 15 is 10 megahertz.

A Personal Computer (PC) 20 inputs check data to the test-target device 10 and obtains the output result from the test-target device 10, thereby checking the integrated circuits 11 to 15 mounted on the test-target device 10. FIGS. 7A and 7B are drawings of an example of the check data employed to check the integrated circuit. FIG. 7A is a drawing of an example of the check data when all of the integrated circuits 11 to 15 are checked. FIG. 7B is a drawing of an example of the check data when only the integrated circuit 13 is checked.

In FIGS. 7A and 7B, check data A to E are data for checking the integrated circuits 11 to 15, respectively. Headers A to E are control data corresponding to the check data A to E, respectively. When checking the integrated circuits 11 to 15, the PC 20 obtains the check result by letting the check data depicted in FIG. 7A pass through the integrated circuits 11 to 15.

Also, when checking any one of the integrated circuits 11 to 15 (for example, when checking the integrated circuit 13), the PC 20 obtains the check result by letting the check data depicted in FIG. 7B pass through the integrated circuits 11 to 15. Here, the operation speed when the PC 20 performs a check (in other words, data transfer rate of the check data) is equal to the slowest one of the operation speeds of the integrated circuits 11 to 15.

Another technology for an integrated-circuit check has been known in which a test signal is detected by a JTAG test node and a route for each integrated circuit is selectively controlled according to the detected test signal (for example, refer to Japanese Translation of PCT International Application (Kohyo) No. 2006-519388).

However, in the conventional technologies explained above, JTAG-function-provided integrated circuits cannot be efficiently checked, and disadvantageously requiring a long time for check.

For example, when a failure occurs in an integrated circuit after shipment of the product due to a temporary contact failure because of a soldering failure of a specific terminal of the integrated circuit, an attachment of dust, or others, there is no measure of on-site checking of normality of a connection state between specific terminals of each integrated circuit at the time of occurrence of a failure. When the product is returned to a factory, even if a failure check is performed, the temporary failure occurring on-site cannot be reproduced, taking time to specify a failure portion.

Moreover, in checking the device having a failure in an integrated circuit, not a general PC but a check-dedicated PC including an external tester function has to be connected to the test-target device for performing these checks, thereby taking time for checks.

Furthermore, when the integrated circuits to be checked or to be written with data are in a cascade connection (for example, refer to FIG. 6), a check or data writing is performed at the slowest one of the data transfer rates of the integrated circuits, thereby requiring a long time for the check and data writing. In particular, a large amount of time is required when a large amount of data is to be written in an integrated circuit.

Also, normally, JTAG interfaces are in a cascade connection with a PC as a starting point. When a malfunction (a connection miss, a device failure, etc.) occurs at any point connecting the integrated circuits, it is difficult to specify where the malfunction occurs. To specify a suspected failure point, a procedure of cutting off an arbitrary JTAG route among the integrated circuits and returning the route back to a PC side has to be repeated, taking a long time to specify the failure point.

SUMMARY

According to one aspect of the present invention, a JTAG-function-provided integrated circuit board includes a circuit information storage unit that has stored therein operation clock information for JTAG for a plurality of integrated circuits with JTAG routes being connected in a star shape and check information for checking the integrated circuits in association with each of the integrated circuit, an input controlling unit that, when an integrated circuit to be checked is specified from among the integrated circuits, determines operation clock information for JTAG and check information for the specified integrated circuit based on the information stored in the circuit information storage unit, and uses a JTAG function to input the check information to the specified integrated circuit with an operation clock for JTAG according to the determined operation clock information for JTAG, a malfunction determining unit that determines a malfunction of the integrated circuit based on the check information and output information output from the integrated circuit to which the check information is input, and a determination-result storage unit that has stored therein the determination result of the malfunction determining unit.

According to another aspect of an embodiment, a method for checking includes storing in a storage unit, by a JTAG-function-provided integrated circuit board, operation clock information for JTAG for a plurality of integrated circuits with JTAG routes being connected in a star shape and check information for checking the integrated circuits in association with each of the integrated circuit, inputting by the JTAG-function-provided integrated circuit board, when an integrated circuit to be checked is specified from among the integrated circuits, by determining operation clock information for JTAG and check information for the specified integrated circuit based on the information stored in the storage unit, and using a JTAG function to input the check information to the specified integrated circuit with an operation clock for JTAG according to the determined operation clock information for JTAG, determining by the JTAG-function-provided integrated circuit board, a malfunction of the integrated circuit based on the check information and output information output from the integrated circuit to which the check information is input, and storing in the storage unit by the JTAG-function-provided integrated circuit board, the determination result of the malfunction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 2 is a drawing of an example of a data structure of a check information storage memory;

FIG. 3 is a drawing of an example of a data structure of a clock information storage memory;

FIG. 4 is a drawing of an example of a data structure of a decision table;

DESCRIPTION OF EMBODIMENT(S)

With reference to the attached drawings, an exemplary embodiment of a JTAG-function-provided integrated circuit board according to the present invention is explained in detail below.

First, features of the integrated circuit board according to the present invention are explained. The integrated circuit board according to the present embodiment has a Joint Test Action Group (JTAG) function, and has a plurality of integrated circuits to be checked connected thereon with their JTAG routes connected in a star shape. The integrated circuit board has stored therein operation clock data for JTAG for each integrated circuit and check data for checking each integrated circuit. When an integrated circuit to be checked is specified, operation clock data and check data for the specified integrated circuit are determined. With an operation clock for JTAG corresponding to the determined operation clock data for JTAG, the determined check data is input to the specified integrated circuit. Then, based on the check data and output data output from the integrated circuit to which the check data is input, the integrated circuit board determines a malfunction in the integrated circuit, and then stores the determination result in a storage device. In the following explanation of the present embodiment, the operation clock for JTAG is referred to simply as an operation clock.

In this manner, the integrated circuit board according to the present invention itself inputs check data in the specified integrated circuit to determine a malfunction of the integrated circuit and stores the determination result in the storage device. Even for a temporary failure occurring on-site, the failure position can be efficiently specified, whereby the check time is reduced.

Also, the integrated circuit board according to the present embodiment itself independently checks the integrated circuit. Therefore, no PC dedicated for check is required, whereby the check time is reduced.

Furthermore, in the integrated circuit board according to the present embodiment, the JTAG routes of the integrated circuits are connected in a star shape, and a check is performed with a clock according to the operation clock data for JTAG for each integrated circuit. Therefore, when a check is performed, an integrated circuit with a higher operation clock for JTAG does not need to follow a slower operation clock for JTAG of another integrated circuit, whereby the check time is reduced.

Still further, the integrated circuit board according to the present embodiment obtains output information corresponding to check information individually from each integrated circuit. Therefore, it is easy to specify an integrated circuit where a malfunction occurs, whereby the check time is reduced.

Figure 1:
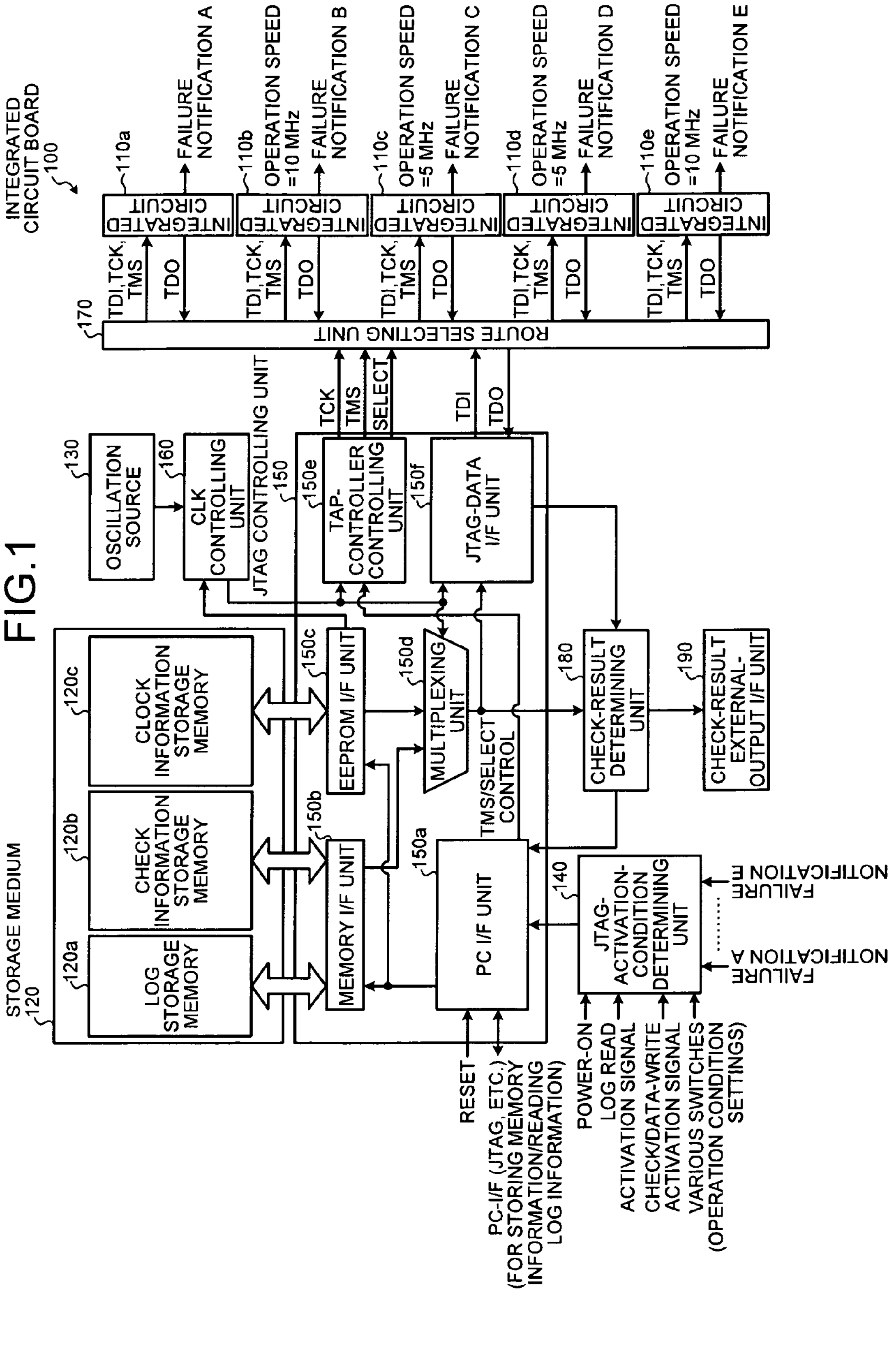
FIG. 1 is a functional block diagram of a configuration of an integrated circuit board according to an embodiment.

Next, the configuration of the integrated circuit board according to the present embodiment is explained. FIG. 1 is a functional block diagram of the configuration of an integrated circuit board 100 according to the present embodiment. As depicted in FIG. 1, the integrated circuit board 100 includes integrated circuits 110*a* to 110*e*, a storage medium 120, an oscillation source 130, a JTAG-activation-condition determining unit 140, a JTAG controlling unit 150, a clock (CLK) controlling unit 160, a route selecting unit 170, a check-result determining unit 180, and a check-result external-output I/F unit 190.

The integrated circuits 110*a* to 110*e* are integrated circuits with JTAG interfaces (for example, Large Scale Integration (LSI), Field Programmable Gate Array (FPGA), Programmable Logic Device (PLD), etc.). Each of the integrated circuits 110*a* to 110*e* is connected to the route selecting unit 170 (JTAG routes are connected in a star shape). Note in the present embodiment that the integrated circuit 110*c* is taken as a PLD and the integrated circuit 110*e* is taken as an FPGA by way of example.

The storage medium 120 is a storage unit that has stored therein various information for use in checking or data writing of the integrated circuits 110*a* to 110*e*, for example. Specifically, the storage medium 120 includes a log storage memory 120*a*, a check information storage memory 120*b*, and a clock information storage memory 120*c*.

The log storage memory 120*a* is a storage unit that has stored therein, for example, the check results obtained by the check-result determining unit 180. The check information storage memory 120*b* is a storage unit that has stored therein check data for use in checking the integrated circuits 110*a* to 110*e* and write data (data for defining or changing an internal logic circuit, such as PLD) to be written in the integrated circuits 110*a* to 110*e*.

FIG. 2 is a drawing of an example of a data structure of the check information storage memory 120*b*. As depicted in FIG. 2, the check information storage memory 120*b* has stored therein a term, an address, and check/write data in association with each other. Each address includes setting value bits and lower bits.

When an address is determined by the JTAG controlling unit 150 (which will be explained further below), a process corresponding to the determined address (SCAN test, net test, data writing to an integrated circuit, LOG reading) and information for use in processing (check data or write data) are determined. In the following, the address determined by the JTAG controlling unit 150 is referred to as a determined address.

In FIG. 2, when the determined address matches any of addresses in first to fifth terms, a SCAN test is performed. For the SCAN test, check data associated with the address matching the determined address is used. In FIG. 2, #A SCAN data to #E SCAN data are check data for the integrated circuits 110*a* to 110*e* to perform a SCAN test, respectively. In the SCAN test, it is determined whether the check data input to an integrated circuit is output as it is from the integrated circuit, thereby checking a malfunction in the integrated circuit.

Also, in FIG. 2, when the determined address matches any of addresses in sixth to eleventh terms, a net test is performed. For the net test, check data associated with the address matching the determined address is used. In FIG. 2, #A net test data for peripheral check to #E net test data for peripheral check are check information for performing a net test on the integrated circuits 110*a* to 110*e*, respectively. In the net test, check information is input to each of the connected integrated circuits, and it is determined with reference to output information output from each integrated circuit whether each integrated circuit is connected without a break.

Here, when the determined address matches the address in the eleventh term, with net data for all-device peripheral check associated with the eleventh term, a net test for all integrated circuits 110*a* to 110*e* is performed.

Furthermore, in FIG. 2, when the determined address matches any of the addresses in twelfth and thirteenth terms, a data writing process is performed on the integrated circuit 110*c* or 110*e*. Data to be written in each of these integrated circuits is write data associated with the address matching the determined address. Here, #C PLD data for writing is write data to be written in the integrated circuit 110*c*, whilst #E FPGA data for writing is write data to be written in the integrated circuit 110*e*.

Still further, in FIG. 2, when the determined address matches an address in a fourteenth term, a process of reading LOG information (information stored in the log storage memory 120*a*) is performed. When the LOG information is read, data is extracted from a LOG information storage area associated with the address matching the determined address.

The clock information storage memory 120*c* is a storage unit that has stored therein operation clock information for JTAG for the integrated circuits 110*a* to 110*e*. FIG. 3 is a drawing of an example of the data structure of the clock information storage memory 120*c*. As depicted in FIG. 3, the clock information storage memory 120*c* has stored therein a device Identification (ID) for identifying an integrated circuit and operation clock data for JTAG in association with each other.

Here, in FIG. 3, a device ID "A" corresponds to the integrated circuit 110*a*; a device ID "B" corresponds to the integrated circuit 110*b*; a device ID "C" corresponds to the integrated circuit 110*c*; a device ID "D" corresponds to the integrated circuit 110*d*; and a device ID "E" corresponds to the integrated circuit 110*e*.

Referring back to the explanation of FIG. 1, the oscillation source 130 is a unit that generates a clock. The oscillation source 130 outputs a generated clock to the CLK controlling unit 160. The JTAG-activation-condition determining unit 140 is a unit that makes a determination as to an integrated circuit to be checked or an integrated circuit in which data is to be written, a determination as to a check type, and other determinations, and outputs the determination result to the JTAG controlling unit 150.

Specifically, the JTAG-activation-condition determining unit 140 holds a decision table, and makes various determinations by using the decision table. FIG. 4 is a drawing of an example of the data structure of the decision table. As depicted in FIG. 4, the decision table includes a term, setting value bits, process summary, and activation condition.

Here, the setting value bits indicate a value set in advance by a user with a switch (for example, a Dip switch). The value of the setting value bits is assumed to be held by the JTAG-activation-condition determining unit 140. When the value of the setting value bits matches any of values in first to sixth terms, a SCAN test is performed on any of the integrated circuits 110*a* to 110*e*. When the value of the setting value bits matches any of values in seventh to twelfth terms, a net test is performed on any of the integrated circuits 110*a* to 110*e*.

When the value of the setting value bits matches any of values in thirteenth and fourteenth terms (when upper four bits of the setting value bits indicate "0010"), data is written in either one of the integrated circuit 110*c* or 110*e*. When the value of the setting value bits matches a value in a fifteenth term, data is written in both the integrated circuits 110*c* and 110*e*.

When the value of the setting value bits matches a value in a sixteenth term (when upper four bits of the setting value bits indicate "0010"), a net test is performed on integrated circuits in the periphery of the integrated circuit where a failure occurs. When the value of the setting value bits matches a value in a seventeenth term, a failure LOG information is read.

The activation condition indicates a condition for performing a check on or data writing in any of the integrated circuits 110*a* to 110*e*. For example, the activation condition includes a condition that the integrated circuit board 100 is powered on, a condition that an external switch (not shown) is pressed, and a condition that a failure occurs in any of the integrated circuits 110*a* to 110*e*.

For example, with the setting value bits being set at "00000000", when the integrated circuit board 100 is powered on or when the external switch is pressed, the JTAG-activation-condition determining unit 140 determines that a SCAN test is performed on the integrated circuit 110*a* (refer to FIG. 4).

Then, the JTAG-activation-condition determining unit 140 outputs to the JTAG controlling unit 150 a value of the setting value bits, a check type (SCAN test, net test, data writing, etc.), and a device ID of an integrated circuit to be processed as the determination result.

For example, with the setting value bits being set at "00000000", when the integrated circuit board 100 is powered on, the JTAG-activation-condition determining unit 140 outputs to the JTAG controlling unit 150 a value of the setting value bits of "00000000", a check type of "SCAN test", and a device "A" of the integrated circuit to be processed as the determination result.

The JTAG controlling unit 150 is a unit that obtains necessary data from the storage medium 120 based on the determination result input from the JTAG-activation-condition determining unit 140 and performs a check on or data writing in any of the integrated circuits 110*a* to 110*e*. As depicted in FIG. 1, the JTAG controlling unit 150 includes a PC Interface (I/F) unit 150*a*, a memory I/F unit 150*b*, an electrically erasable programmable read-only memory (EEPROM) I/F unit

150*c*, a multiplexing unit 150*d*, a Test Access Port (TAP)-controller controlling unit 150*e*, and a JTAG-data I/F unit 150*f*.

The PC I/F unit 150*a* is a unit that performs data communication with a PC (not shown). Also, when obtaining the determination result from the JTAG-activation-condition determining unit 140, the PC I/F unit 150*a* outputs the determination result to the memory I/F unit 150*b*. Furthermore, when obtaining the check result from the check-result determining unit 180, the PC I/F unit 150*a* outputs the obtained check result to the memory I/F unit 150*b*.

The memory I/F unit 150*b* is a unit that obtains, when obtaining the determination result from the PC I/F unit 150*a*, relevant data from the check information storage memory 120*b* based on the obtained determination result.

The memory I/F unit 150*b* generates a determined address by adding a lower bit to the setting bits included in the determination result. The lower bit is assumed to be set according to the type of process (SCAN test, net test, data writing) or the data capacity of an integrated circuit to be processed.

The memory I/F unit 150*b* compares the generated determined address and the check information storage memory 120*b* to extract relevant check/write data, and then outputs the extracted check/write data to the multiplexing unit 150*d*.

When the setting value bits included in the determination result indicate "00001000", the memory I/F unit 150*b* extracts #A SCAN test data to #E SCAN test data one by one included in the first to fifth terms in the check information storage memory 120*b*, and then outputs the extracted data to the multiplexing unit 150*d*.

Also, when the setting value bits included in the determination result indicate "00101xxx", the memory I/F unit 150*b* extracts #C PLD data for writing and #E FPGA data for writing one by one included in the twelfth and thirteenth terms in the check information storage memory 120*b*, and then outputs the extracted data to the multiplexing unit 150*d*.

Furthermore, when the setting value bits included in the determination result indicate "01xxxxxx", the memory I/F unit 150*b* extracts net test data corresponding to the device where a failure occurs from the check information storage memory 120*b*. For example, when a failure occurs in the integrated circuit 110*a* with a device ID "A", the memory I/F unit 150*b* obtains any #A net test data for peripheral check included in the sixth term of the check information storage memory 120*b*, and then outputs the obtained data to the multiplexing unit 150*d*.

Still further, when the setting value bits included in the determination result indicate "1xxxxxxx", the memory I/F unit 150*b* extracts a LOG information storage area included in the fourteenth term of the check information storage memory 120*b*, and then extracts data corresponding to the obtained LOG information storage area from the log storage memory 120*a*. Then, the memory I/F unit 150*b* outputs the log information via the PC I/F unit 150*a* to the PC. Here, when obtaining the check result from the PC I/F unit 150*a*, the memory I/F unit 150*b* registers the obtained check result in the log storage memory 120*a*.

The EEPROM I/F unit 150*c* is a unit that extracts, based on a device ID included in the obtained determination result, when the determination result is obtained from the PC I/F unit 150*a*, operation clock data for JTAG of an integrated circuit corresponding to the device ID from the clock information storage memory 120*c*.

Specifically, the EEPROM I/F unit 150*c* compares the device ID included in the determination result and data in the clock information storage memory 120*c* (refer to FIG. 3) to extract operation clock data for JTAG. The EEPROM I/F unit 150*c* then outputs the operation clock data for JTAG to the multiplexing unit 150*d* and the CLK controlling unit 160.

The multiplexing unit 150*d* is a unit that multiplexes the check/write data input from the memory I/F unit 150*b*, the operation clock data for JTAG input from the EEPROM I/F unit 150*c*, and others. The multiplexing unit 150*d* then outputs the multiplexed data to the TAP-controller controlling unit 150*e*, the JTAG-data I/F unit 150*f*, and the check-result determining unit 180.

The TAP-controller controlling unit 150*e* is a unit that outputs to the integrated circuits 110*a* to 110*e* a control signal for controlling a TAP controller (JTAG standard) in each of the integrated circuits 110*a* to 110*e*. With the TAP-controller controlling unit 150*e* outputting a control signal to the integrated circuits 110*a* to 110*e*, an arbitrary route in the integrated circuits 110*a* to 110*e* is selected.

Also, when obtaining the multiplexed data from the multiplexing unit 150*d*, the TAP-controller controlling unit 150*e* determines an integrated circuit to be checked or onto which writing is performed, and controls the route selecting unit 170 according to the determination result. For example, when the integrated circuit to be checked is the integrated circuit 110*a*, the TAP-controller controlling unit 150*e* controls the route selecting unit 170 to establish a route between the JTAG controlling unit 150 and the integrated circuit 110*a*.

When obtaining the multiplexed data from the multiplexing unit 150*d*, the JTAG-data I/F unit 150*f* outputs check data (or write data) included in the multiplexed data to the route selecting unit 170. Here, the data transfer rate when the JTAG-data I/F unit 150*f* transfers data is in accordance with the operation clock for JTAG input from the CLK controlling unit 160.

Also, at the time of performing a SCAN test or a net test, after check data is input to an integrated circuit to be checked, the JTAG-data I/F unit 150*f* obtains output data output from the integrated circuit. The JTAG-data I/F unit 150*f* then outputs the output data to the check-result determining unit 180.

The CLK controlling unit 160 is a unit that generates, when obtaining the operation clock data for JTAG from the EEPROM I/F unit 150*c*, an operation clock for JTAG according to the obtained operation clock data for JTAG. The CLK controlling unit 160 outputs the generated operation clock for JTAG to the multiplexing unit 150*d*, the TAP-controller controlling unit 150*e*, and the JTAG-data I/F unit 150*f*.

The route selecting unit 170 is a unit that selects a route of an integrated circuit to be checked or in which writing is performed according to the control information input from the TAP-controller controlling unit 150*e*.

The check-result determining unit 180 compares the check data (the check data is included in the multiplexed data) obtained from the multiplexing unit 150*d* and the output data obtained from the JTAG-data I/F unit 150*f* to determine a malfunction point.

When the check data and the output data are compared with each other at the time of performing a SCAN test and they do not match each other, the check-result determining unit 180 determines that a malfunction occurs in the integrated circuit to be checked. Also, at the time of performing a net test, the check-result determining unit 180 refers to the check data and the output data to determine whether each integrated circuit has a broken wire.

For example, in a net test where it is determined whether the integrated circuits 110*a* and 110*b* are appropriately connected to each other, check data is written in the integrated circuit 110*a*, and if the check data written in the integrated circuit 110*a* is output from the integrated circuit 110*b* as output data, it can be determined that the integrated circuits 110*a* and 110*b* are appropriately connected to each other.

When detecting a malfunction, the check-result determining unit 180 outputs a device ID of the integrated circuit in which the malfunction is detected and the like to the PC I/F unit 150*a* as the check result, and also outputs the check result to the check-result external-output I/F unit 190.

The check-result external-output I/F unit 190 is a unit that outputs, when obtaining the check result from the check-result determining unit 180, the obtained check result to an external monitor, display, and others.

Figure 5:
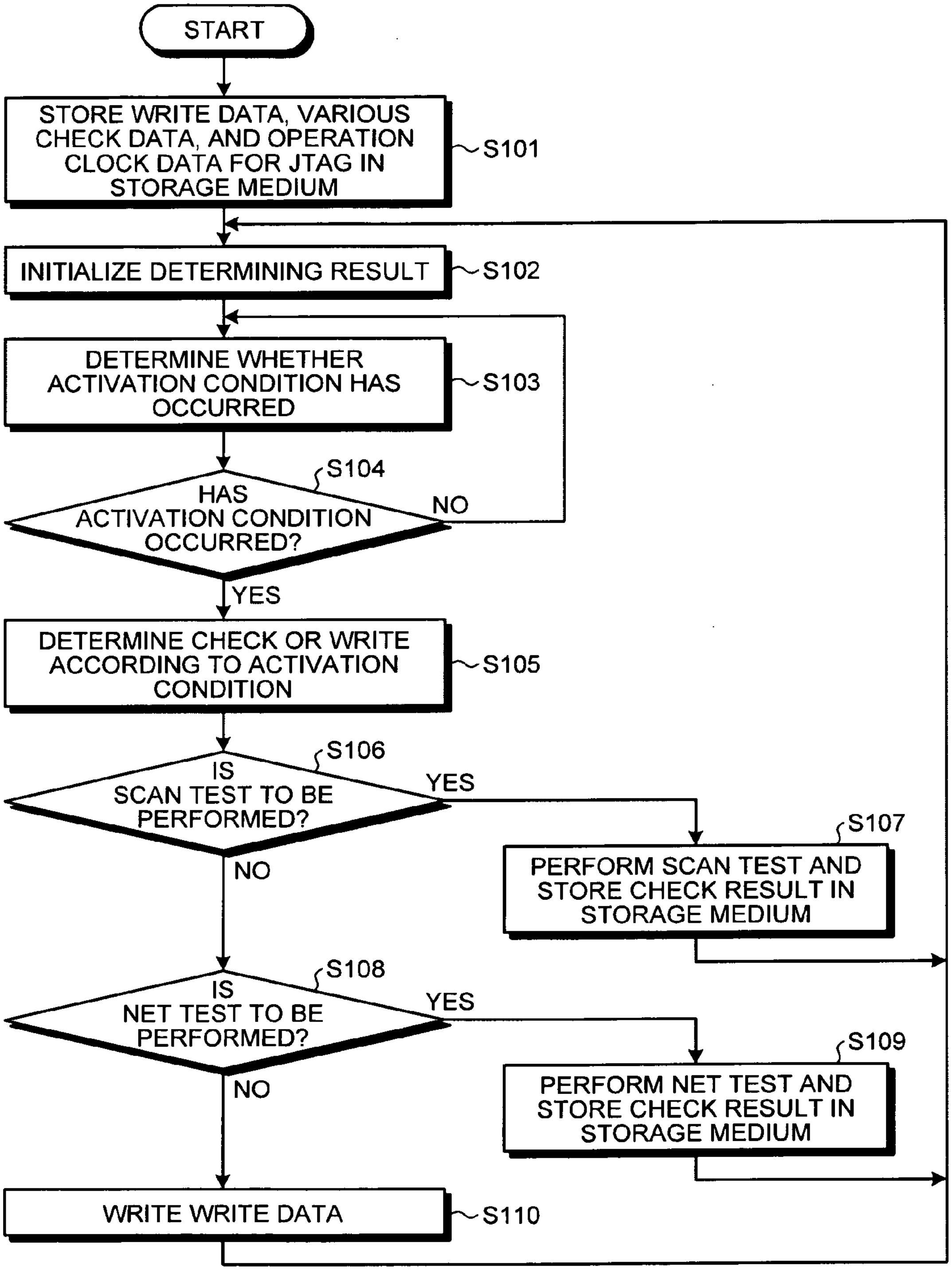
FIG. 5 is a flowchart of a procedure of the integrated circuit board according to the present embodiment.
Figure 6:
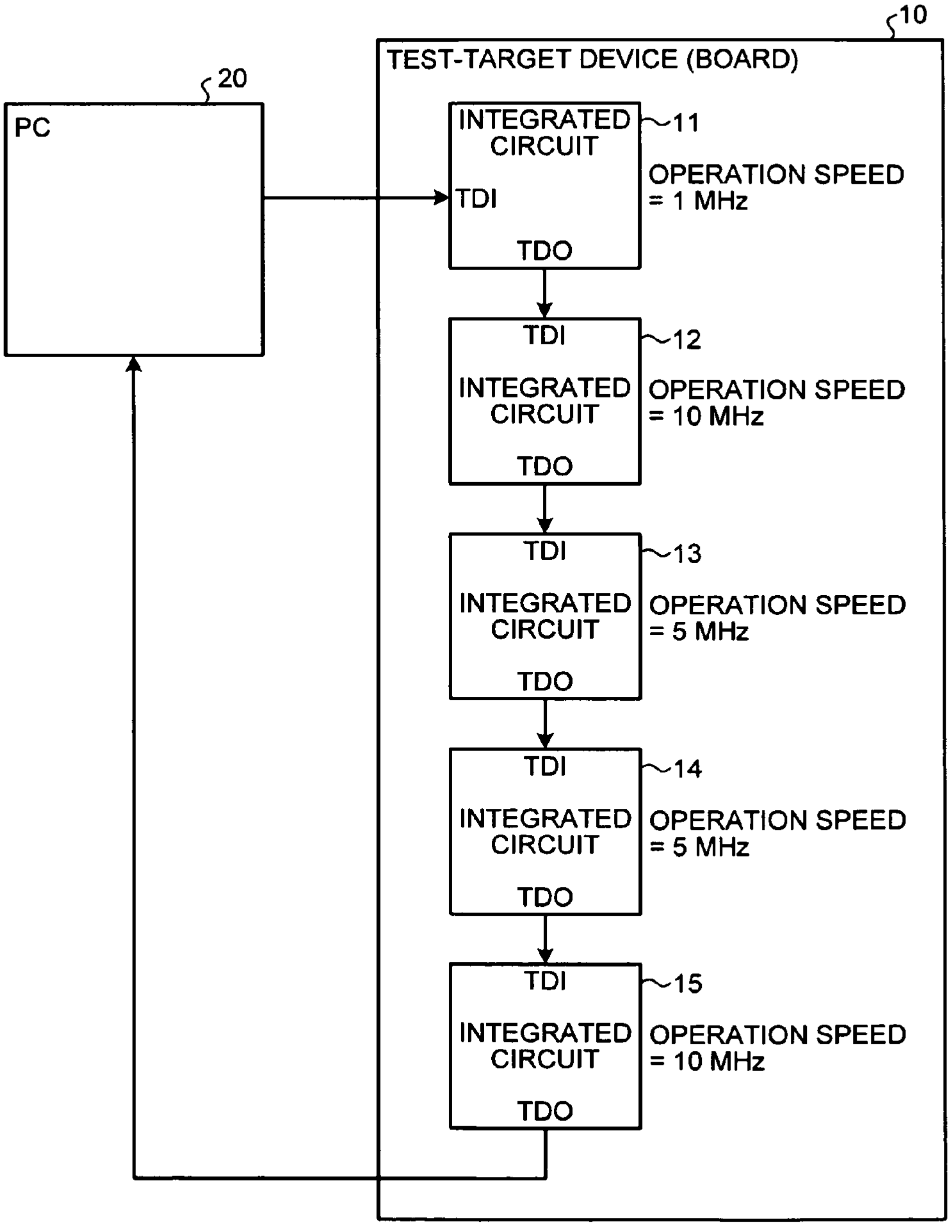
FIG. 6 is a drawing for explaining a conventional integrated-circuit checking method.
Figure 7A:
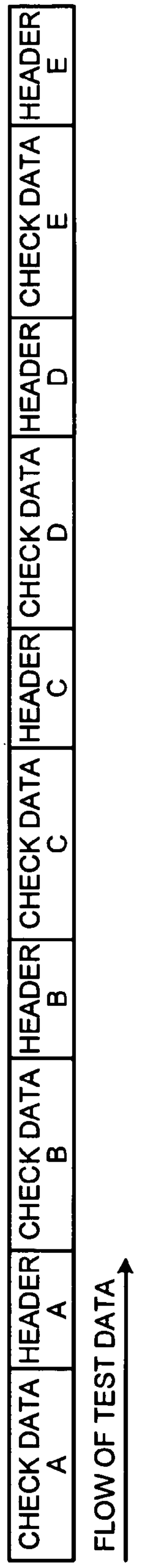
FIG. 7A is a drawing of an example of check data when all integrated circuits are checked.
Figure 7B:
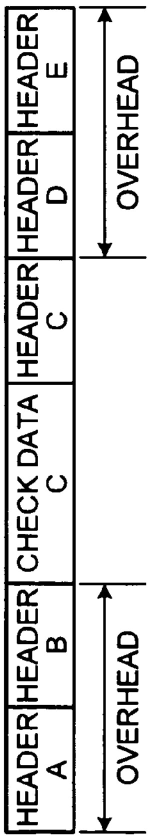
FIG. 7B is a drawing of an example of the check data when only one integrated circuit is checked.

Next, the process procedure of the integrated circuit board 100 according to the present embodiment is explained. FIG. 5 is a flowchart of a procedure of the integrated circuit board 100 according to the present embodiment. As depicted in FIG. 5, the integrated circuit board 100 stores write data, various check data (data for SCAN test and net test), and operation clock data for JTAG in the storage medium 120 (Step S101).

The JTAG-activation-condition determining unit 140 then initializes the determination result output to the JTAG controlling unit 150 (Step S102), determining whether the activation condition has occurred (Step S103).

If the activation condition does not occur (No at Step S104), the procedure goes to Step S103. On the other hand, if the activation condition has occurred (Yes at Step S104), a check or writing is determined according to the activation condition (Step S105).

When a SCAN test is to be performed (Yes at Step S106), the SCAN test is performed, the check result is stored in the storage medium 120 (Step S107), and then the procedure goes to Step S102.

When a SCAN test is not to be performed (No at Step S106), it is determined whether a net test is to be performed. When a net test is to be performed (Yes at Step S108), the net test is performed, the check result is stored in the storage medium 120 (Step S109), and then the procedure goes to Step S102.

On the other hand, if a net test is not to be performed (No at Step S108), write data is written in the integrated circuit (Step S110), and then procedure goes to step S102.

As has been explained above, in the integrated circuit board 100 according to the present embodiment, the JTAG routes of a plurality of integrated circuits to be checked are connected together in a star shape. Operation clock data for JTAG of each integrated circuit and check data for checking each integrated circuit are stored. When an integrated circuit to be checked is specified, operation clock data for JTAG and check data for the specified integrated circuit are determined. With an operation clock for JTAG according to the determined operation clock data for JTAG, the determined check data is input to the specified integrated circuit. Based on the check data and output data output from the integrated circuit to which this check data is input, the integrated circuit board determines a malfunction in the integrated circuit, and then stores the determination result in a storage device. With this, an integrated-circuit check can be efficiently performed, thereby reducing the time required for the check.

Furthermore, among the processes explained in the embodiment, all or part of the processes explained as being automatically performed may be manually performed, or all or part of the processes explained as being manually performed may be automatically performed through a known method. In addition, the process procedure, the control procedure, specific names, and information including various data and parameters mentioned in the specification and the drawings can be arbitrarily changed unless otherwise specified.

According to the JTAG-function-provided integrated circuit board disclosed herein, an integrated-circuit check is performed according to an operation clock for JTAG for each integrated circuit, and the check result is stored. With this, the integrated-circuit check can be efficiently performed, thereby reducing time required for the check.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An integrated circuit board comprising:

a circuit information storage unit that has stored therein operation clock information for a plurality of integrated circuits being connected in a star shape and check information for checking the integrated circuits in association with each of the integrated circuits;

an input controlling unit that, when an integrated circuit to be checked is specified from among the integrated circuits, determines operation clock information and check information for the specified integrated circuit based on the information stored in the circuit information storage unit, and inputs the check information to the specified integrated circuit with an operation clock according to the determined operation clock information;

a malfunction determining unit that determines a malfunction of the integrated circuit based on the check information and output information output from the integrated circuit to which the check information is input; and a determination-result storage unit that has stored therein the determination result of the malfunction determining unit.

2. The integrated circuit board according to claim 1, wherein the input controlling unit has stored therein a table in which a condition for performing a check on the integrated circuit, an integrated circuit to be checked when the condition is satisfied, and check information for use in the check are associated with one another, and inputs the check information to the integrated circuit based on the table.

3. The integrated circuit board according to claim 1, wherein the malfunction determining unit performs a scan test for determining whether the input check information can be output as it is as output information by comparing the check information and the output information.

4. The integrated circuit board according to claim 1, wherein the malfunction determining unit performs a net test for determining whether each of the integrated circuits is connected by comparing the check information and the output information.

5. The integrated circuit board according to claim 1, wherein the circuit information storage unit further has stored therein write information to be written in the integrated circuits and, when an integrated circuit for writing is specified, the input controlling unit determines write information corresponding to the specified integrated circuit and writes the determined write information in the specified integrated circuit.

6. A method for checking comprising:

storing in a storage unit, by an integrated circuit board, operation clock information for a plurality of integrated circuits being connected in a star shape and check information for checking the integrated circuits in association with each of the integrated circuits;

inputting by the integrated circuit board, when an integrated circuit to be checked is specified from among the integrated circuits, by determining operation clock information and check information for the specified integrated circuit based on the information stored in the storage unit, and the check information to the specified integrated circuit with an operation clock according to the determined operation clock information;

determining by the integrated circuit board, a malfunction of the integrated circuit based on the check information and output information output from the integrated circuit to which the check information is input; and storing in the storage unit by the integrated circuit board, the determination result of the malfunction.

7. The method according to claim 6, wherein a table in which a condition for performing a check on the integrated circuit, an integrated circuit to be checked when the condition is satisfied, and check information for use in the check are associated with one another is stored in the storage unit, the check information is input to the integrated circuit based on the table.

8. The method according to claim 6, wherein a scan test is performed for determining whether the input check information can be output as it is as output information according to comparison between the check information input to the integrated circuits and the output information output from the integrated circuits.

9. The method according to claim 6, wherein a net test is performed for determining whether each of the integrated circuits is connected or not according to comparison between the check information input to the integrated circuits and the output information output from the integrated circuits.

10. The method according to claim 6, further comprising storing in the storage unit, write information to be written in the integrated circuits and, when an integrated circuit for writing is specified, write information corresponding to the specified integrated circuit is determined and the determined write information is written in the specified integrated circuit.

* * * * *